United States Patent
Inoue et al.

[19]

[11] Patent Number: 5,861,866
[45] Date of Patent: Jan. 19, 1999

[54] LSI MASK PATTERN EDIT APPARATUS WITH CONTOUR LINE INTENSITY DISTRIBUTION DISPLAY METHOD OF RESOLUTION FOR LITHOGRAPHY

[75] Inventors: Soichi Inoue, Yokohama; Satoshi Tanaka, Kawasaki, both of Japan

[73] Assignee: Kabushiki Kaisha Toshiba, Kawasaki, Japan

[21] Appl. No.: 816,676

[22] Filed: Mar. 13, 1997

[30] Foreign Application Priority Data

Mar. 14, 1996 [JP] Japan .................................. 8-057962

[51] Int. Cl.⁶ .............................. G09G 5/36; G03F 9/00; G03C 5/00
[52] U.S. Cl. ................................ 345/139; 430/5; 430/322
[58] Field of Search ............................ 430/4, 5, 30, 269, 430/311, 322, 323, 396; 356/394; 378/34, 35; 702/167; 250/493.1; 345/139, 133

[56] References Cited

U.S. PATENT DOCUMENTS

| | | | |
|---|---|---|---|
| 4,576,884 | 3/1986 | Reisman | 430/30 |
| 4,806,987 | 2/1989 | Mori et al. | 355/53 |
| 5,496,683 | 3/1996 | Asano | 430/269 |
| 5,595,857 | 1/1997 | Fukuda et al. | 430/322 |
| 5,627,625 | 5/1997 | Ogawa | 355/53 |
| 5,650,854 | 7/1997 | Sugawara | 356/394 |
| 5,700,601 | 12/1997 | Hasegawa et al. | 430/5 |
| 5,725,973 | 3/1998 | Han et al. | 430/5 |
| 5,733,687 | 3/1998 | Tanaka et al. | 430/5 |
| 5,736,280 | 4/1998 | Tsudaka | 430/5 |

*Primary Examiner*—Jeffery Brier
*Assistant Examiner*—Paul A. Bell
*Attorney, Agent, or Firm*—Oblon, Spivak, McClelland, Maier & Neustadt, P.C.

[57] ABSTRACT

An intensity distribution display method of displaying a intensity distribution of electromagnetic waves or charged particle beams fallen on a sample, is characterized by comprising the step of displaying the intensity distribution with the use of contour lines defined by $Ie/(1+a \cdot n/100)$, where $Ie$ is a desired intensity value, $a$ is a constant rate (%), and $n$ is an integer.

10 Claims, 9 Drawing Sheets

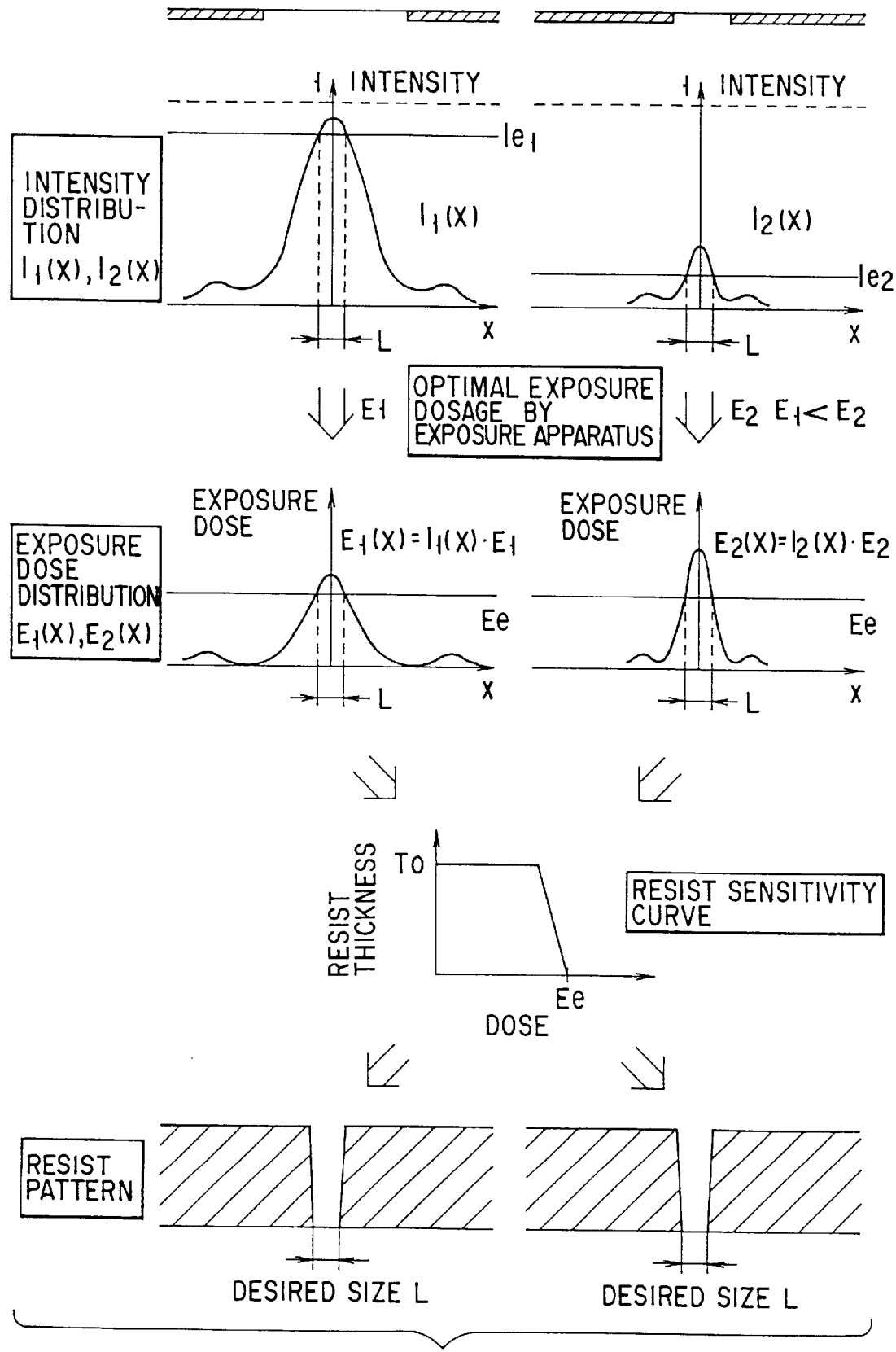
F I G. 5

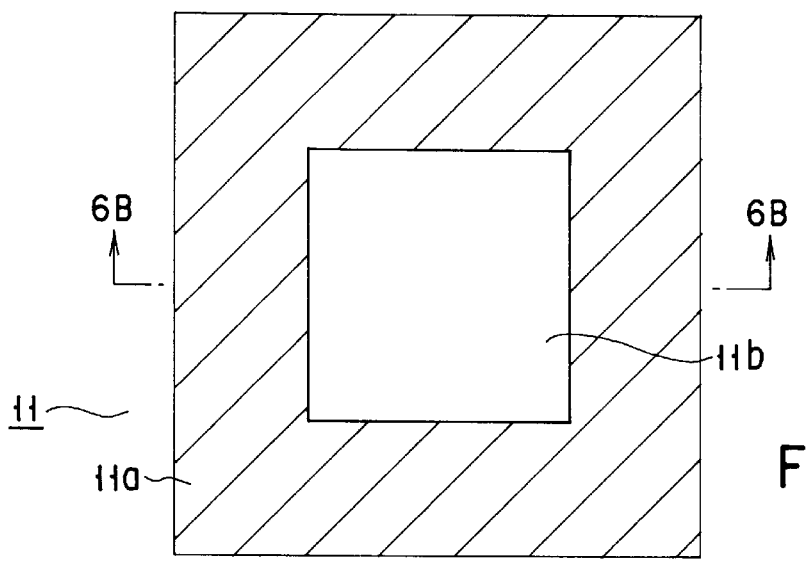
F I G. 6A
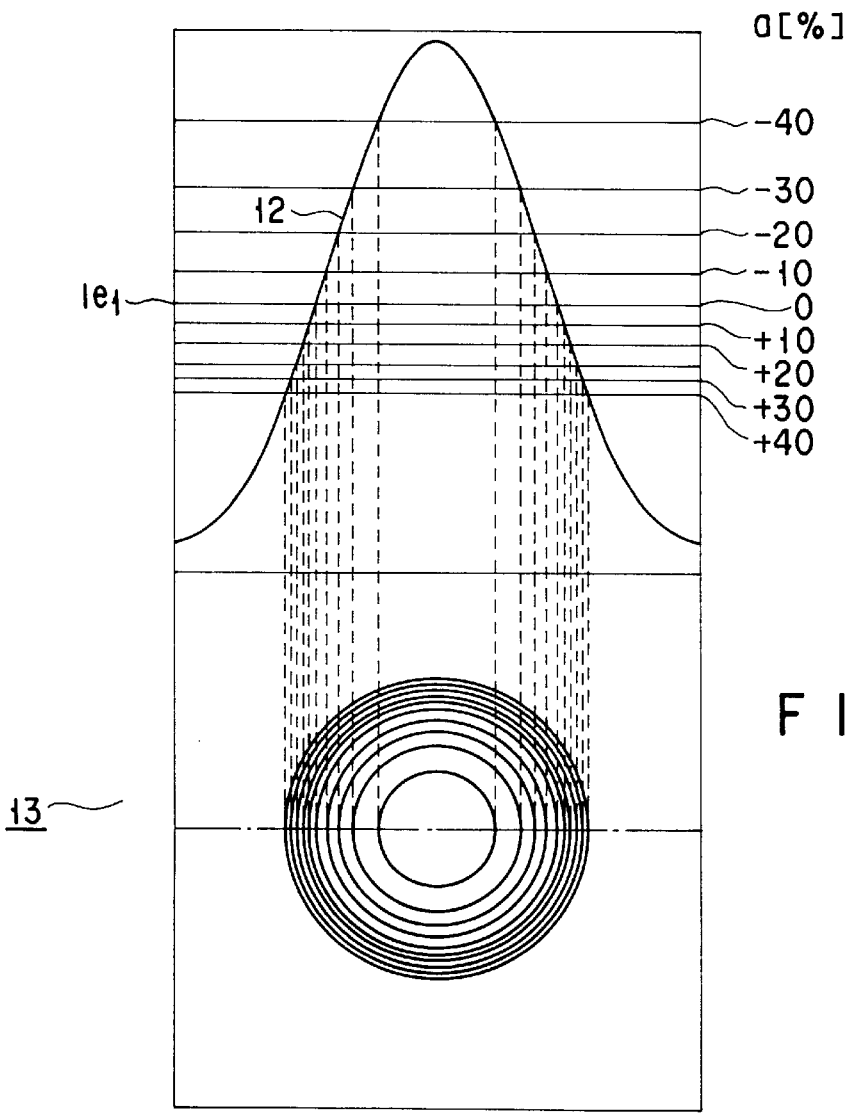
F I G. 6B

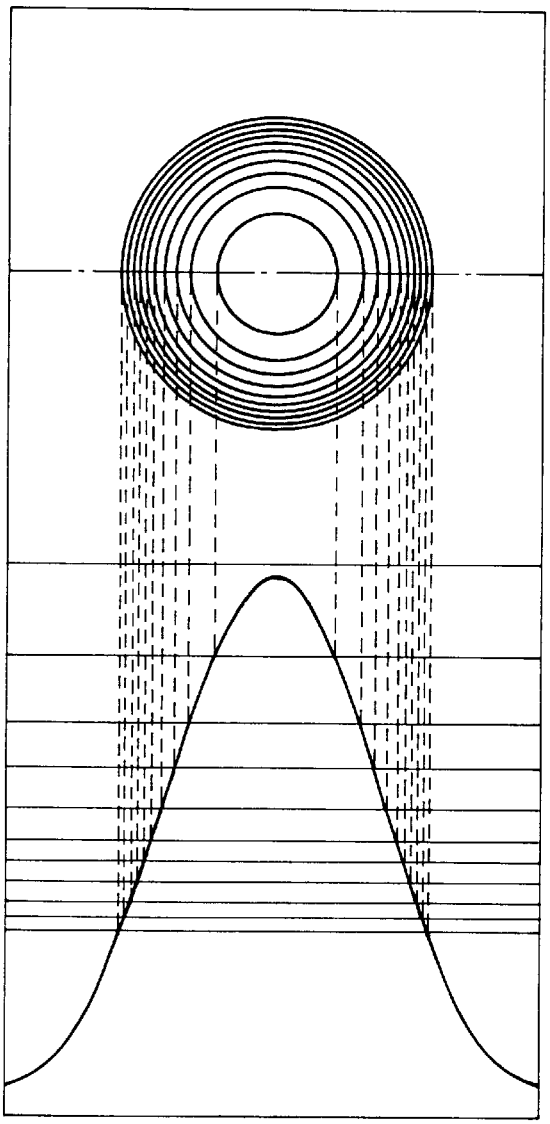 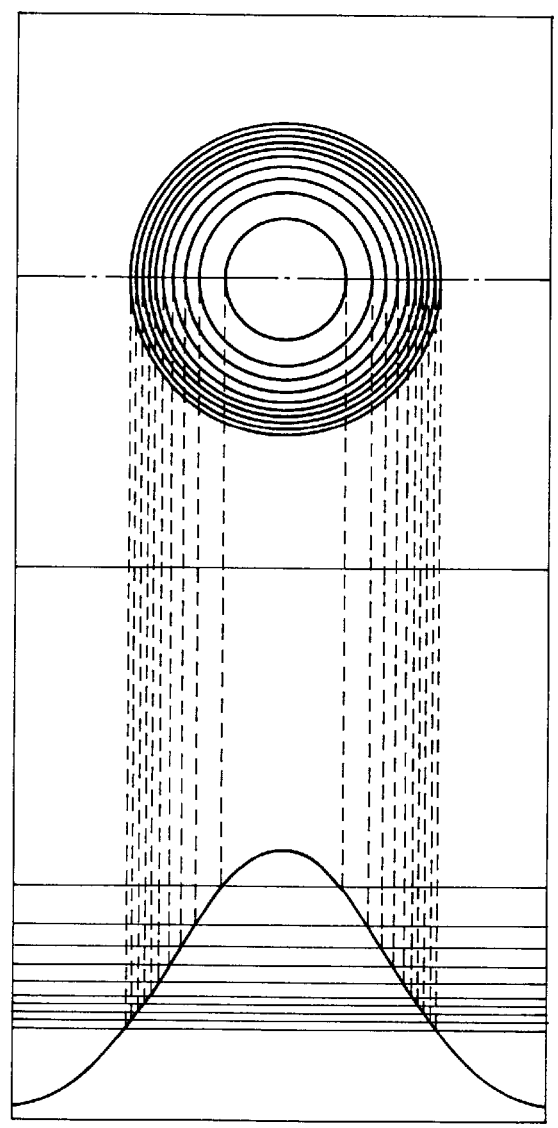
F I G. 7A        F I G. 7B

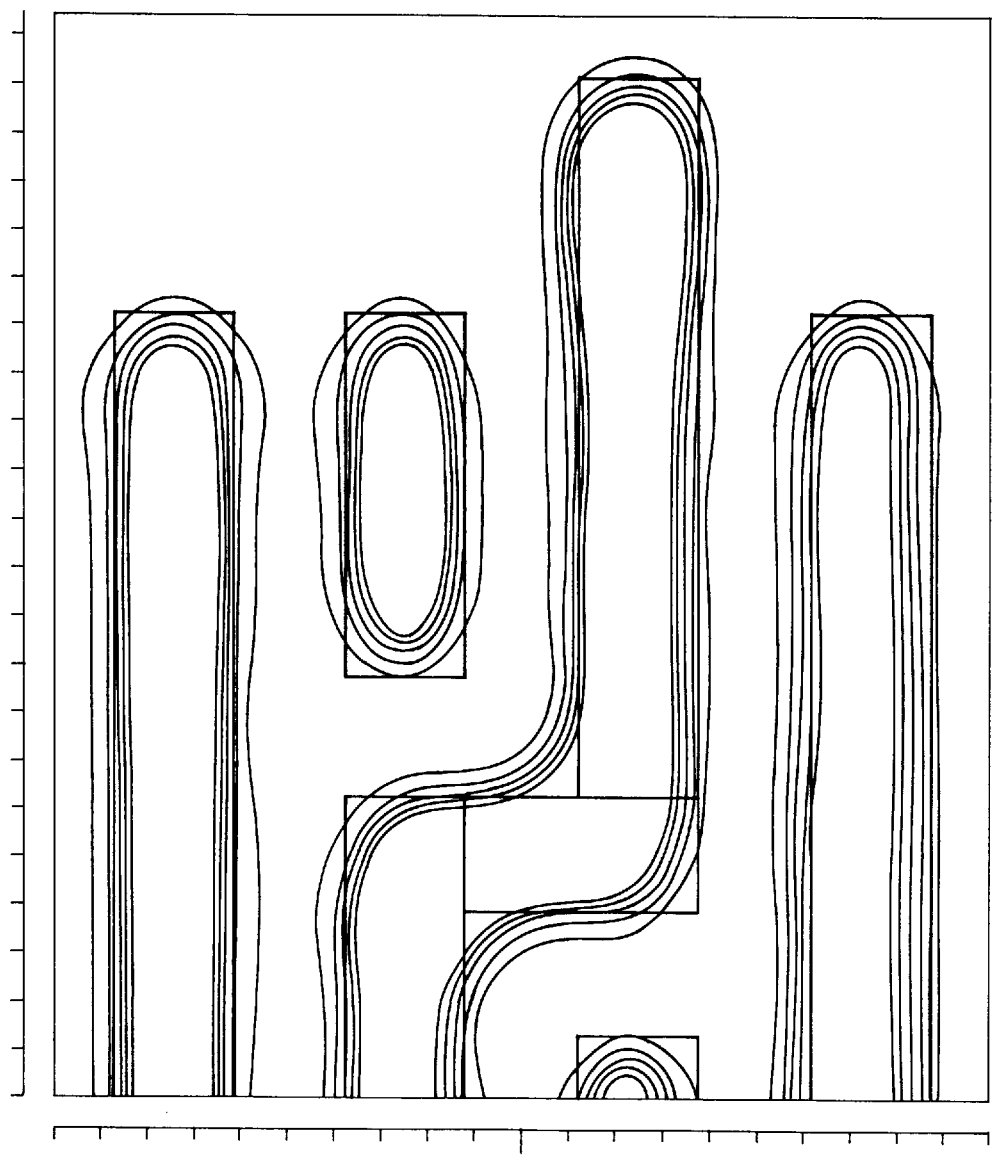
F I G. 8

LSI MASK PATTERN EDIT APPARATUS WITH CONTOUR LINE INTENSITY DISTRIBUTION DISPLAY METHOD OF RESOLUTION FOR LITHOGRAPHY

BACKGROUND OF THE INVENTION

The present invention relates to an intensity distribution display method of displaying a intensity distribution such as electromagnetic wave or charged particle beam and a mask pattern edit apparatus for correcting the proximity effect on a mask pattern which is caused in lithography process depending on the line width of the pattern.

In the production of, e.g., an LSI pattern with the use of a mask, when the linewidth of the pattern is reduced to almost as a small value as the wavelength of exposure light used for the lithography process, the refraction of the light causes the lines of the pattern to be thinned in the linewidth or bridged between adjacent ones creating so-called proximity effects and thus declining the quality of the pattern. If the proximity effect appears, the mask pattern is modified for compensation by an adjustment in place or using experimental knowhow.

It is of course extremely difficult to predict and estimate the proximity effect for modifying the mask pattern. A mask pattern edit apparatus for ease of the prediction of the proximity effect has been proposed (as disclosed in Japanese Patent Application KOKAI Publication No. 64-19470).

FIG. 1 is a block diagram showing a basic arrangement of a conventional mask pattern edit apparatus. A pattern position information input/edit section 61 comprises a pattern position input/edit section 64 of, e.g., a tablet form and a pattern position input information storage/edit section 65 for storing pattern position information entered. An intensity distribution calculation section 62 is provided for determining a intensity distribution from the pattern position. The mask pattern and the intensity distribution are displayed at a time on the monitor 66 of a figure display section 63.

FIGS. 2A and 2B illustrate a procedure of mask pattern editing in the apparatus. FIG. 2A shows mask patterns 71 and 72 without concerning the proximity effect, in which the intensity distribution is denoted by the dotted, contour lines 73.

The relative intensity between the mask pattern 71 and 72 is about 0.3 times that at the centers of the mask patterns 71 and 72 and provides low contrast of the two patterns 71 and 72 hence declining the resolution. FIG. 2B shows two mask patterns 74 and 75 spaced further from each other and their intensity distributions are defined by the contour lines 76. As the distance between the two mask patterns 74 and 75 is increased, the intensity fallen on the distance area between the same drops thus improving the resolution. The pattern information modified through concerning the proximity effect is saved as a mask data for producing a mask used in the LSI production.

The conventional mask pattern edit apparatus allows a modified, improved mask pattern of fine lines to be produced through predicting and estimating the proximity effect on its original mask pattern. Accordingly, the proximity effect which is used to be analyzed with a separate apparatus can efficiently be identified and prevented.

Although not explained with the above apparatus of a citation, it is known that the intensity is expressed as a value normalized by the intensity on a wafer without the mask. Therefore, the contour lines of the figures represent different intensity levels into which the full intensity of 1 is equally divided.

This is explained in more detail using a report (of "Rim phase-shift mask combined with off-axis illumination; a path to 0.5 $\lambda$/NA geometries" by T. A. Brunner, Optical Engineering, October 1993, Vo.32, No. 10, p.2337). FIGS. 3A and 3B are cited from the report. In the report, numerals expressed in $\lambda$/NA are used. It is assumed herein, the wavelength of the exposure light, $\lambda$=250 nm, numerical aperture, NA=0.5, and the coherence factor, $\sigma$=0.5.

FIG. 3A is a plan view of a mask pattern. FIG. 3B shows an intensity distribution on the wafer using the mask pattern shown in FIG. 3A. The five contour lines represent 10%, 20%, 30%, 40%, and 50% respectively of the full intensity, equal to 1, on the wafer without mask.

However, the following disadvantages are involved.

As shown in FIGS. 2A and 2B, the contour lines indicate the effectiveness of the exposure light on the wafer. The contour lines display a gradation of the different levels based on the full intensity fallen directly on the wafer without mask. Hence, it may appear that the contour lines do not indicate equally in both the number and the density when the level of relative intensity is different between two distributions of the same image quality (resolution) as shown in FIGS. 4B and 4D. This will cause the two distributions to be recognized as two different distributions. FIGS. 4B and 4D are intensity distributions (images) of hole-pattern mask shown in FIGS. 4A and 4C, respectively. These intensity distributions is shown by the contour line and a distribution of sectional view of center of the hole-pattern. In FIGS. 4A and 4C, reference numerals 41 and 44 are light-shielded portions, and reference numerals 42 and 43 are light transparent portions. The light-transparent portions 42, 43 are squares having 0.3×0.3 $\mu$m and these transmissions are respectively 100% and 50%. Exposure wavelength is 248 nm, a numerical aperture NA, of the projection optical system is 0.5, and coherence factor is 0.6. While a mask having a 50% light-transparent transmission requires twice exposure time (to increase the exposure dose), its resolution is same as that for a mask having a 100% light-transparent transmission.

The difference in the relative intensity may affect the throughput of lithography process but is not related to the resolution. The two distributions should be displayed identically to be compared for the resolution. Also, the conventional manner may give a fault result when two images which have sharp profile with a low relative intensity level and dull profile with a high relative intensity level are compared from each other in the resolution.

The individual contour lines show the plane shapes of resist patterns printed by exposure doses corresponding to the intensities denoted by their respective contour lines. However, the contour lines are plotted at equal intervals of an intensity level and will hardly tell quantitative change of the shape of the resist pattern in relation to the exposure dose which varies at a constant rate from the optimal exposure dose.

The conventional contour lines will permit the distributions of the same resolution (quality) to be recognized as different ones since they are expressed in relative intensity levels. As the contour lines are plotted at equal intervals of the intensity level, it will be difficult to quantitatively detect the plane shape of a resist pattern which changes in response to an actual illumination varied at a constant rate from its desired intensity.

BRIEF SUMMARY OF THE INVENTION

It is an object of the present invention to provide an intensity distribution display method and a mask pattern edit apparatus for displaying intensity distributions which are identical in the image quality (resolution) but different in the relative intensity level with the use of contour lines of the same number and density and allowing a change of the plane shape of a resist pattern in relation to variation of the exposure dose at a constant rate to be quantitatively recognized.

An intensity distribution display method of displaying a intensity distribution of electromagnetic waves or charged particle beams fallen on a sample, according to the present invention is characterized by comprising the step of displaying the intensity distribution with the use of contour lines defined by $Ie/(1+a \cdot n/100)$, where Ie is a desired intensity value, a is a constant rate (%), and n is an integer.

Another intensity distribution display method according to the present invention is characterized by comprising the step of displaying an inverse of the intensity distribution with the use of contour lines spaced at a constant rate relative to a desired exposure setting value.

Preferred embodiments of the present invention are implemented by:

(1) The sample is exposed to have a pattern of lines thereon corresponding to a desired LSI mask pattern.

(2) The desired intensity value is subjected to the sensitivity of a photosensitive layer of the sample.

A mask pattern edit apparatus according to the present invention is characterized by comprising: means for inputting and editing the position of an LSI mask pattern; intensity distribution calculation means for determining a intensity distribution fallen through the LSI mask pattern on a photosensitive layer of a sample; display means for displaying the mask pattern and the intensity distribution at a time; and contour line calculation means for calculating and displaying the intensity distribution on the displaying means with the use of contour lines defined by $Ie/(1+a \cdot n/100)$, where Ie is a desired intensity value, a is a constant rate (%), and n is an integer.

Another mask pattern edit apparatus according to the present invention is characterized by comprising: means for inputting and editing the position of an LSI mask pattern; intensity distribution calculation means for determining a intensity distribution fallen through the LSI mask pattern on a photosensitive layer of a sample; display means for displaying the mask pattern and the intensity distribution at a time; contour line calculation means for calculating and displaying the intensity distribution on the displaying means with the use of contour lines defined by $Ie/(1+a \cdot n/100)$, where Ie is a desired intensity value, a is a constant rate (%), and n is an integer; and display switching means for selectively displaying either the contour lines determined by the contour line calculation means or the contour lines assigned at equal intervals of an intensity level.

A further mask pattern edit apparatus according to the present invention is characterized by comprising: means for inputting and editing the position of an LSI mask pattern; intensity distribution calculation means for determining a intensity distribution fallen through the LSI mask pattern on a photosensitive layer of a sample; display means for displaying the mask pattern and the intensity distribution at a time; and contour line calculation means for calculating and displaying an inverse of the intensity distribution on the displaying means with the use of contour lines spaced at a constant rate relative to a desired exposure setting value.

A still further mask pattern edit apparatus according to the present invention is characterized by comprising: means for inputting and editing the position of an LSI mask pattern; intensity distribution calculation means for determining a intensity distribution fallen through the LSI mask pattern on a photosensitive layer of a sample; display means for displaying the mask pattern and the intensity distribution at a time; contour line calculation means for calculating and displaying an inverse of the intensity distribution on the displaying means with the use of contour lines spaced at a constant rate relative to a desired exposure setting value; and display switching means for selectively displaying either the contour lines determined by the contour line calculation means or the contour lines assigned at equal intervals of an intensity level.

The operation of the present invention will be explained referring to FIG. 5. There are two intensity distributions $I_1(x)$ and $I_2(x)$, where x is a spatial coordinate, imaged under different exposure conditions. It is now examined which distribution is favorable for lithography process.

The intensity distribution is expressed as a relative value normalized by the intensity on a wafer without mask (i.e., a reference intensity). The peak value of $I_1(x)$ is greater than that of $I_2(x)$ as shown. Therefore, the exposure dose per unit time at the peak of $I_1(x)$ is also higher than that of $I_2(x)$. In other words, when the same resist process is used, an exposure time of $I_1(x)$ is shorter than that of $I_2(x)$ to resolve a desired size.

The conventional display method plots the contour lines by classifying the reference intensity into different levels of equal interval, hence indicating the exposure dose per unit time but failing to display levels of the resolution for the lithography process. The display method of the present invention can successfully display of the resolution of the intensity distribution in view of the lithography process. The reasonableness of the display method of the present invention is proved by converting the intensity distribution into a distribution of exposure dose as shown in FIG. 5.

When a setting value of the exposure dose in the apparatus is $E_1$, a distribution of the actual exposure dose $E_1(x)$ is calculated by multiplying the relative intensity distribution $I_1(x)$ and the setting value $E_1$, $$E_1(x)=I_1(x)E_1 \qquad (1)$$

Equally, $E_2(x)$ is expressed by:

$$E_2(x)=I_2(x)E_2 \qquad (2)$$

In FIG. 5, $Ie_1$ and $Ie_2$ are optimum levels for making the desired size of the pattern. The resist layer is exposed to the exposure dose distribution $E_1(x)$. If the threshold of exposure dose on a sensitivity curve of the resist layer of positive type is Ee, the resist layer is removed in an area exposed to the exposure dose of higher than Ee and remains in an area exposed to not higher than Ee.

As Ee is an intrinsic value of the resist material (or the resist processing), it is determined from the type of the resist material (or resist processing) to be used. For having a target size L on the resist material (or in the resist process) with the threshold of Ee, the exposure dose setting $E_1$ of the apparatus should be estimated with $Ie_1$ corresponding to Ee. It is now assumed that the exposure dose setting $E_1$ is an optimum setting value of the exposure dose. Then, $E_1$, $I_1$, and Ee are expressed by:

$$Ee=Ie_1 E_1$$

$$E_1=Ee/Ie_1 \qquad (3)$$

Similarly, $$Ee = Ie_2 \cdot E_2$$
$$E_2 = Ee/Ie_2 \tag{4}$$

When the exposure apparatus is set with $E_1$ and $E_2$, the target size L of the resist pattern is obtained by each of the intensity distributions.

It is now examined which intensity distribution is favorable for the resolution of the lithography process. It is important for the lithography process not to change the feature size drastically, even if the exposure dose setting varies. The optimum exposure dose setting depends on the intensity distribution. Therefore, it is desirable for evaluating a change in the feature size due to the variation of the exposure dose to examine the size of pattern in response to a change of the exposure dose setting at a constant rate (by+a %) from its optimum value.

When the exposure dose settings are $E_1(a)$ and $E_2(a)$ and their corresponding intensity levels are $Ie_1(a)$ and $Ie_2(a)$, they are calculated from the equations (3) and (4), $$\begin{aligned}
E_1(a) &= E_1(1 + a/100) = Ee/Ie_1(a) \tag{5}\\
&= Ee(1 + a/100)/Ee_1\\
Ie_1(a) &= Ee/\{E_1(1 + a/100)\} \tag{6}\\
&= Ie_1/(1 + a/100)\\
E_2(a) &= E_2(1 + a/100) = Ee/Ie_2(a) \tag{7}\\
&= Ee(1 + a/100)/Ie_2\\
Ie_2(a) &= Ee/\{E_2(1 + a/100)\} \tag{8}\\
&= Ie_2/(1 + a/100)
\end{aligned}$$

As will be described later (First Embodiment), the contour lines for the two intensity distributions $I_1(x)$ and $I_2(x)$ are plotted according to the equations (6) and (8), respectively, thus indicating the change of the pattern size in response to the variation of the exposure dose. More specifically, the change of the pattern size in response to the variation of the exposure dose is displayed by the contour lines determined from $Ie/(1+a \cdot n/100)$ or assigned to n of the intensity levels at the constant rate, a.

The display method of the present invention allows the change of the pattern size in response to the variation of the exposure dose at the constant rate (by a %) to be evaluated thus comparing two or more intensity distributions for the resolution regardless of the relative intensity level. Also, when the contour lines for $1/I_1(x)$ and $1/I_2(x)$ are plotted according to the equations (5) and (7) (as will be explained with the second embodiment), the previous effect will be achieved.

The present invention permits two or more intensity distributions which are identical in the resolution but different in the relative intensity level to be displayed with the use of contour lines of the same number and density and thus recognized as the identical resolution (image quality). Since the relative levels of the intensity distribution is not related to the resolution while may affect the throughput of a lithography process, the present invention is advantageously applicable to examination of the resolution in any intensity distribution. Also, the contour lines are defined by variation at a constant rate from the optimum value of exposure dose, hence allowing the change of plane shape of a resist pattern in response to the variation of the exposure dose to be detected quantitatively. Furthermore, the present invention permits either its method or a conventional method to be selectively displayed when demanded by the user for the sake of his application.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 illustrates a function of the present invention and shows an intensity distribution, an exposure dose distribution, a resist sensitive curve and a resist pattern;

FIGS. 6A and 6B are diagrams explaining a contour line display method of a first embodiment of the present invention;

FIGS. 7A and 7B are diagrams explaining the advantage of the contour line display method of the first embodiment of the present invention;

FIG. 8 shows the intensity distribution overlapped with a mask pattern according to the first embodiment;

DETAILED DESCRIPTION OF THE INVENTION

The present invention will be described in more detail referring to illustrative embodiments.

(First Embodiment)

FIGS. 6A and 6B are diagrams explaining an intensity distribution display method of the first embodiment of the present invention. FIG. 6A is a plan view of a mask pattern. FIG. 6B shows a contour lines and a cross sectional intensity distribution taken along the line 6B—6B of FIG. 6A, fallen at a best focusing location on a wafer through the mask pattern shown in FIG. 6A.

A hatched region is a light-shielded portion 11a and a light-transparent portion 11b of a square shape, 0.3×0.3 µm, is defined by the light-shielded portion 11a. It is assumed for an intensity distribution 12 that the wavelength of exposure light is 248 nm, the numerical aperture NA of an optical projection system is 0.5, the coherence factor is 0.6, and the size of a desired resist pattern is 0.275 μm. 13 is a group of contour lines plotted according to the method of the present invention. The relative intensity $Ie_1$ for making the pattern size of 0.275 μm is 0.3. The optimum value of exposure setting $E_1$ is expressed by:

$$E_1 = Ee/Ie_1$$

Hence, an exposure setting $E_1(a)$ changed by a % from the optimum exposure setting $E_1$ is:

$$E_1(a) = (1 + a \cdot n/100)E_1, \text{ when n is an integer.}$$

The relative intensity corresponding to $E_1(a)$ is then calculated from:

$$\begin{aligned} I_1(a) &= Ee/E_1(a) = Ee/\{(1 + a \cdot n/100)E_1\} \\ &= Ie_1/(1 + a \cdot n/100) \end{aligned}$$

The constant rate, a, was 10, and the integer, n, were −4, −3, −2, −1, 0, 1, 2, 3, and 4 in FIG. 6B.

Figure 4A:
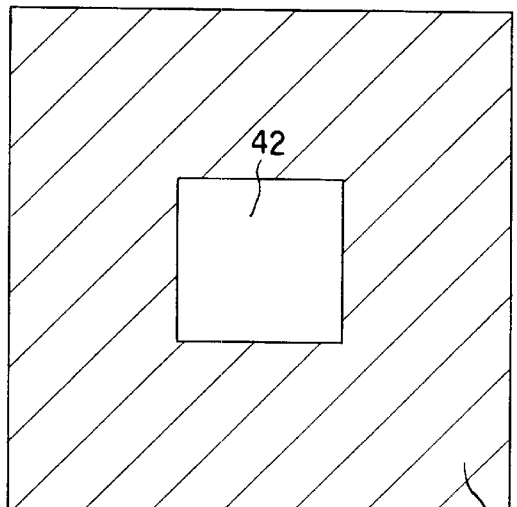
FIGS. 4A to 4D illustrate contour lines showing a mask pattern, contour line of the intensity distribution, and central sectional view of the intensity distribution, explaining a conventional contour line display method.
Figure 4C:
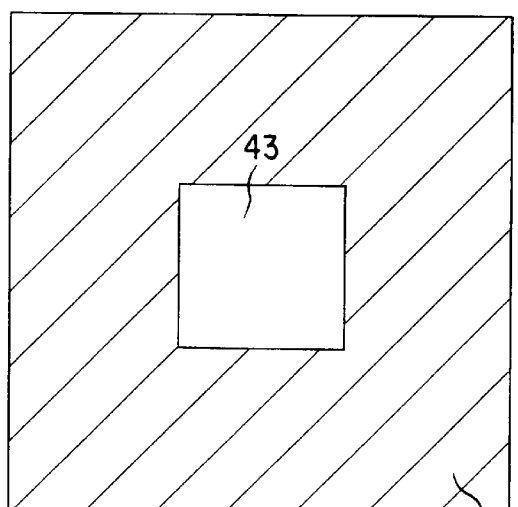
Figure 4B:
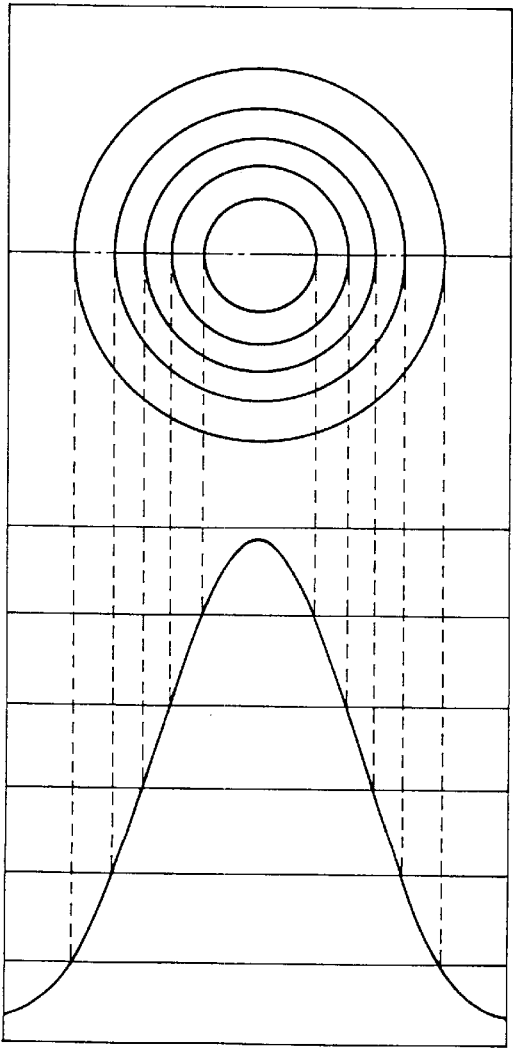
Figure 4D:
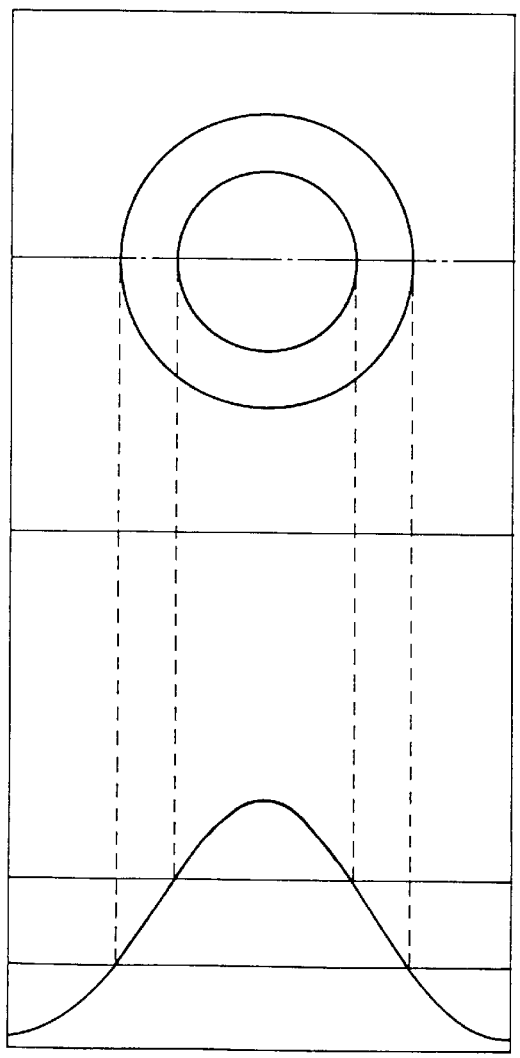

FIGS. 7A and 7B display an intensity distribution by using the contour line display method of the present invention, when masks shown in FIGS. 4A and 4C is exposed in the same exposure conditions as the conventional ones. As apparent, when two identical resolution (image quality) are given with their relative intensities different from each other, their contour lines appear equal in both the number and the density and can easily be recognized as two identical ones. The variation of the relative intensity affects the throughput of lithography process but is not related to the resolution. Accordingly, the display method of the present invention is advantageous in comparing and evaluating the resolution of two or more intensity distributions.

Figure 3B:
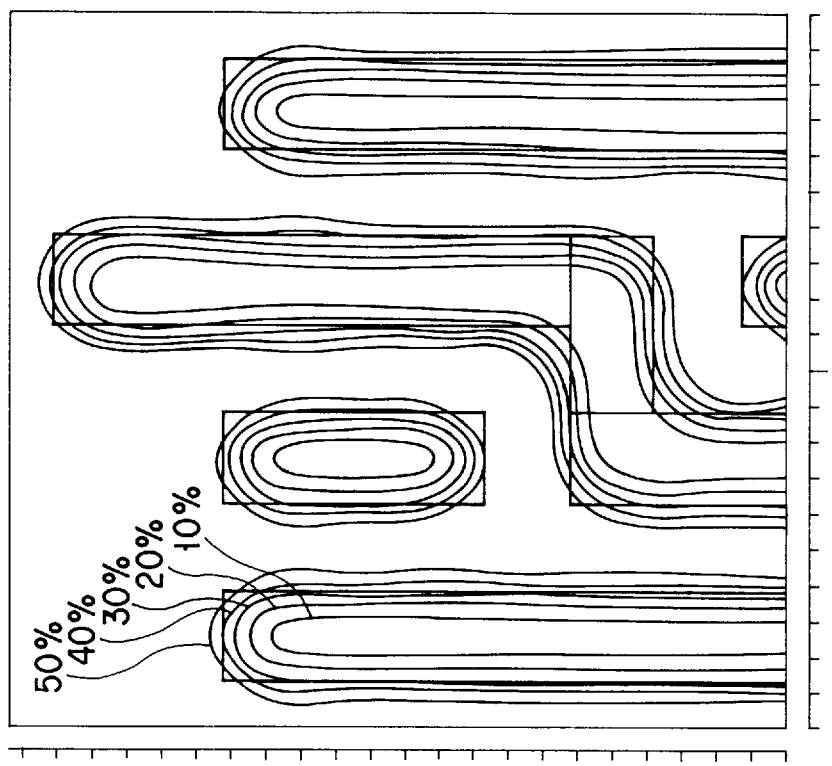
FIGS. 3A and 3B are views showing a mask pattern of the conventional apparatus and a intensity distribution on a wafer fallen through the mask pattern.
Figure 3A:
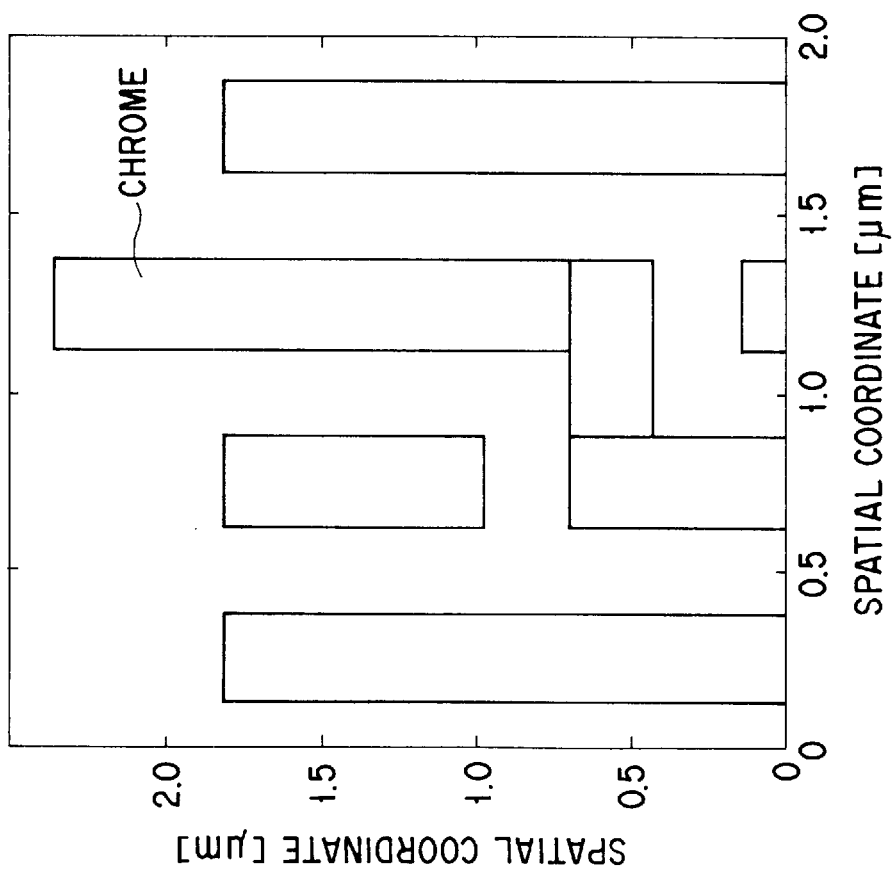

FIG. 8 shows intensity distributions, developed under the exposure conditions of λ=250 nm, NA=0.5, σ=0.5 through the mask pattern shown in FIG. 3A, overlapped with the shape of the mask pattern by the method of the present invention. If a positive resist layer is exposed, a resultant resist pattern is defined by the five contour lines representing intensity levels of, from outside, −20%, −10% 0%, +10%, and +20% the optimum exposure setting.

As understood, the contour lines plotted by the method of this embodiment can display a quantitative change of the plane view of the resist pattern corresponding to the exposure dose which varies at a constant rate from its optimum setting value.

(Second Embodiment)

Figure 9A:
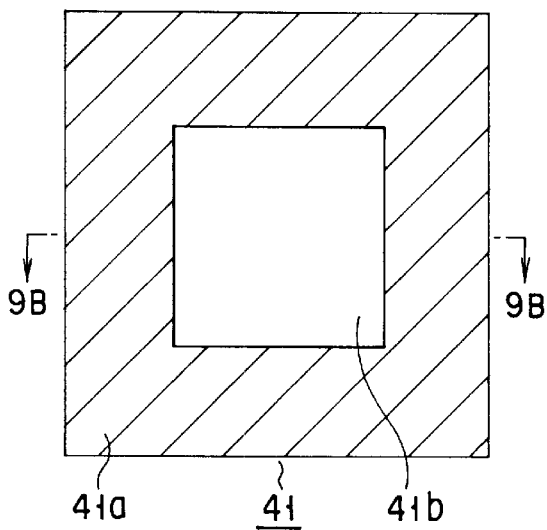
FIGS. 9A to 9C are diagrams explaining a contour line display method of the second embodiment.
Figure 9B:
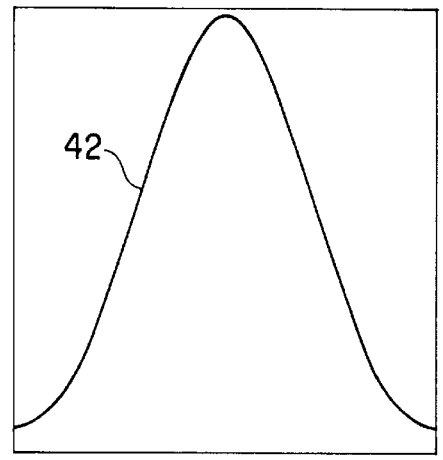
Figure 9C:
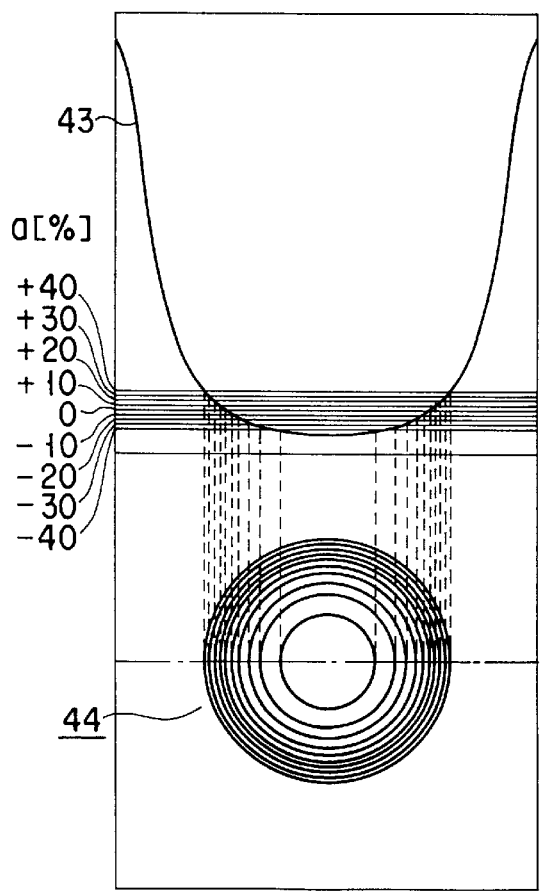

FIGS. 9A to 9C are diagrams explaining an intensity distribution display method of the second embodiment of the present invention. FIG. 9A is a plan view of a mask pattern. FIG. 9B shows a intensity distribution, taken along the line 9B—9B of FIG. 9A, fallen at a best focusing location on a wafer through the mask pattern shown in FIG. 9A. A hatched region shown in FIG. 9A is a light-shielded portion 41a of the mask which defines a light-transparent portion 41b of a square shape, 0.3 by 0.3 μm. It is assumed for an intensity distribution 42 that the wavelength of exposure light is 248 nm, the numerical aperture NA of an optical projection system is 0.5, the coherence factor is 0.6, and the size of a desired resist pattern is 0.275 μm.

FIG. 9C illustrates a distribution of a inverse of the intensity 42 in which the contour lines plotted by the method of this embodiment are denoted by 44. Assuming that the optimum value of exposure setting $E_1$ for making a desired pattern of 0.275 μm size, an exposure setting $E_1(a)$ (changed by a % from the optimum exposure setting $E_1$) is expressed by:

$$E_1(a) = (1 + a \cdot n/100)E_1, \text{ where n is an integer.}$$

The contour lines of the exposure setting $E_1(a)$ are then plotted corresponding to the inverse distribution 43 of the intensity. As the result, a change of the plane shape of a resist pattern corresponding to the exposure setting which varies at a constant rate from its optimum setting value is displayed at 44, Accordingly, the same effect as shown in FIGS. 7A, 7B, and 8 will be achieved. The method of this embodiment is favorable when the intensity distribution contains a less number of values close to zero.

(Third Embodiment)

Figure 10:
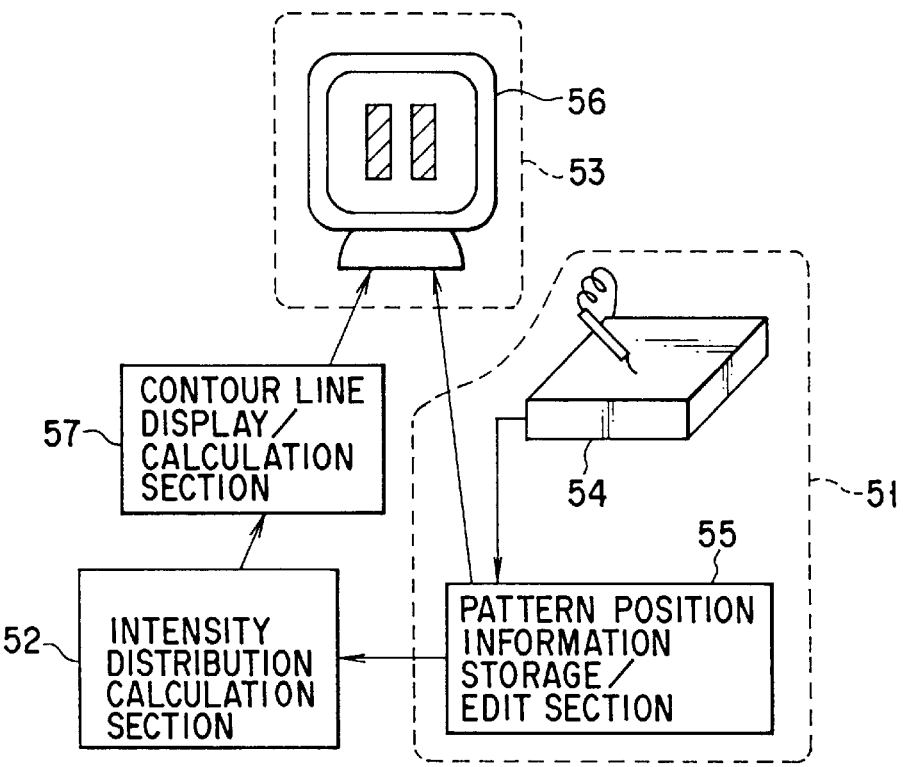
FIG. 10 is a block diagram of a basic arrangement of a mask pattern edit apparatus according to the third embodiment of the present invention.

FIG. 10 is a block diagram of a basic arrangement of a mask pattern edit apparatus showing the third embodiment of the present invention.

The mask pattern edit apparatus of this embodiment comprises a pattern position information input/edit section 51, an intensity distribution calculation section 52, and a figure display section 53 for displaying both a mask pattern and an intensity distribution.

The pattern position information input/edit section 51 includes a pattern position input/edit section 54 for entering and editing the position data of a pattern, and a pattern position information storage/edit section 55 for storing the pattern position data entered. The position and shape data of the mask pattern which are entered and edited is transmitted from the pattern position information storage/edit section 55 to the figure display section 53. The intensity distribution calculation section 52 calculates a intensity distribution from the position and shape data of the mask pattern using a theory of imaging with a partially coherent optical system. The figure display section 53 receives the mask pattern and its intensity distribution from the pattern position information storage/edit section 55 and a contour line calculation section 57 which will be explained later and displays them at one time on a monitor 56 thereof.

Figure 1:
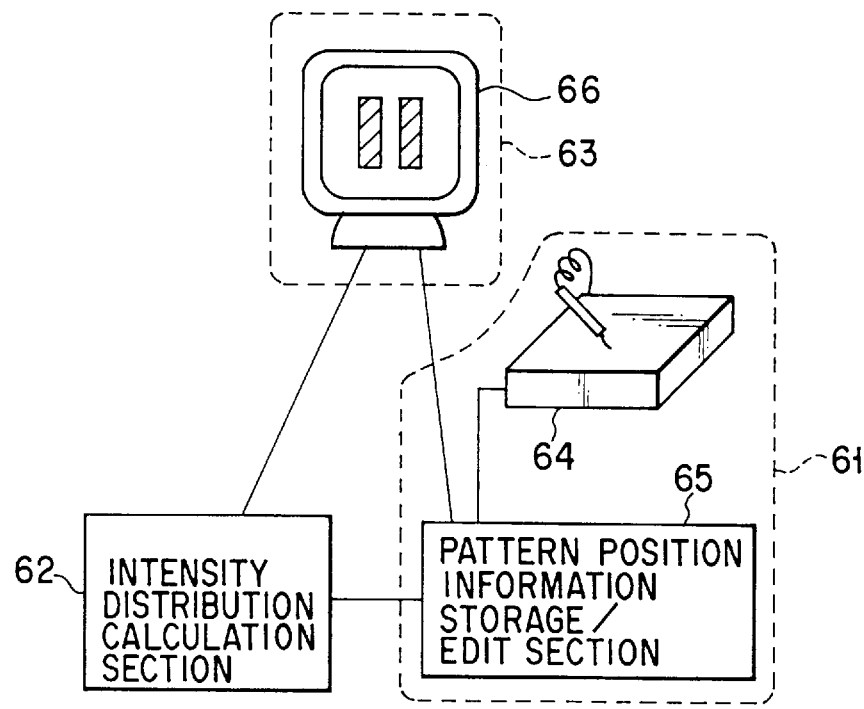
FIG. 1 is a block diagram showing an arrangement of a conventional mask pattern edit apparatus.
Figure 2A:
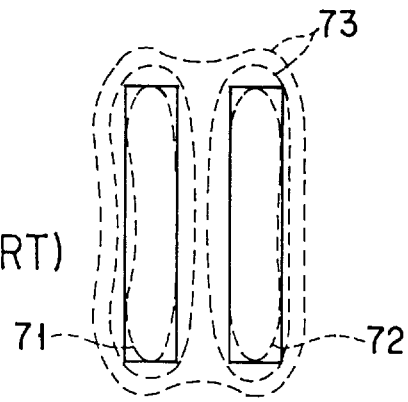
FIGS. 2A and 2B are views showing a procedure of mask pattern editing of the conventional apparatus.
Figure 2B:
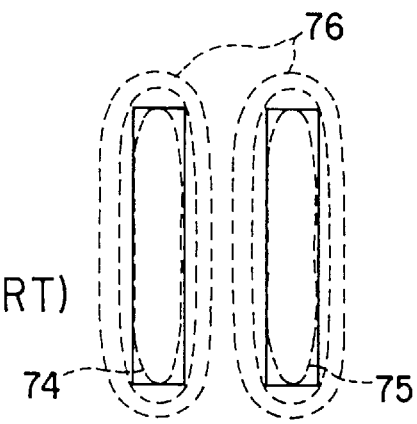

The foregoing arrangement shown in FIG. 10 is substantially similar to that of the conventional apparatus shown in FIG. 1 but differentiated by the fact that the contour line calculation section 57 is interposed between the intensity distribution calculation section 52 and the figure display section 53 for plotting the contour lines in connection with the inverse of a constant rate to a predetermined intensity value, Ie, which is expressed as $Ie/(1 + a \cdot n/100)$.

More specifically, the contour line calculation section 57 determines the contour line from the resultant outputs of the intensity distribution calculation section 52 according to the equation (6) and/or (8). The contour lines display on the monitor 56 of the figure display section 53. It may also be possible to inverse the intensity distribution and then, plot the contour lines spaced at a constant rate corresponding to the distribution as shown in equation (5) and/or (7).

(Fourth Embodiment)

Figure 11:
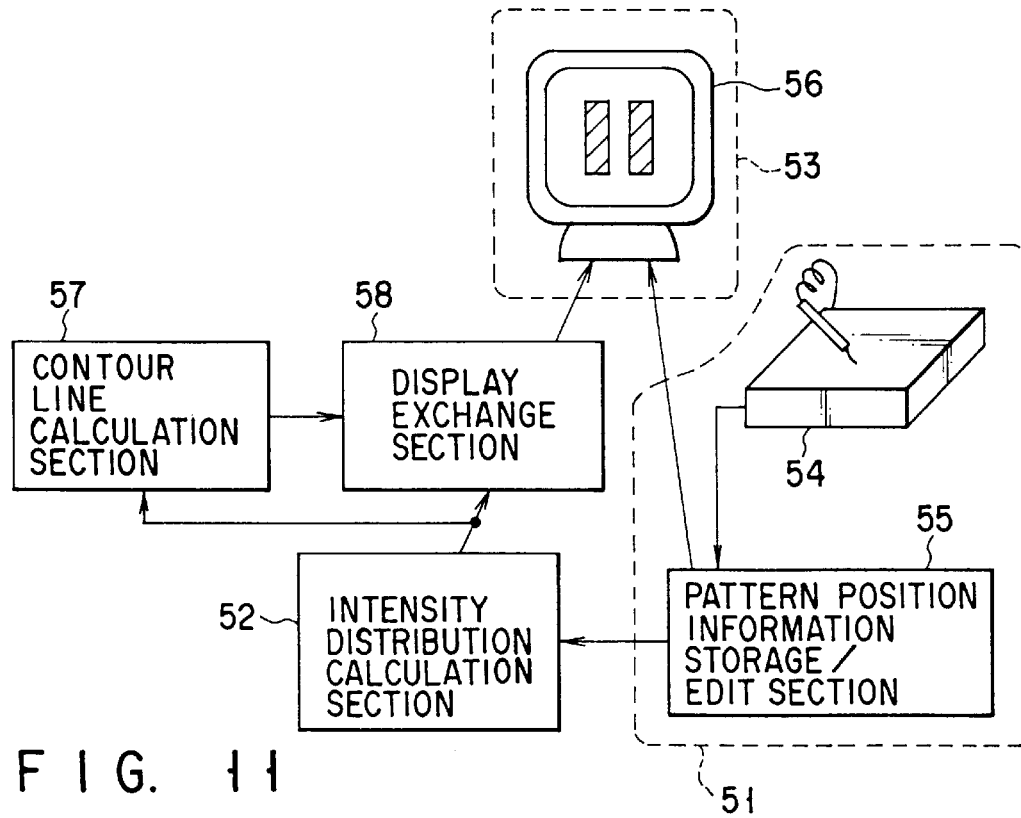
FIG. 11 is a block diagram of a basic arrangement of a mask pattern edit apparatus according to the fourth embodiment of the present invention.

FIG. 11 is a block diagram of a basic arrangement of a mask pattern edit apparatus showing the fourth embodiment of the present invention. In FIG. 11, like components are denoted by like numerals as of FIG. 10 and will be explained in no more detail.

The arrangement shown in FIG. 11 is distinguished from that shown in FIG. 10 by the fact that a display exchange section 58 is interposed between the intensity distribution calculation section 52 and the figure display section 53. The display exchange section 58 is capable of selectively displaying on the figure display section 53 the contour lines plotted by any of the methods of the previous embodiments as well as the conventional method.

This allows the user to select and display his desired contour lines of the distribution for a specific application.

It is appreciated that the present invention is not limited to the above embodiments and various changes and modifications will be made without departing from the scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. An intensity distribution display method of displaying a intensity distribution of electromagnetic waves or charged particle beams fallen on a sample, comprising the step of:

displaying the intensity distribution with the use of contour lines defined by $Ie/(1+a \cdot n/100)$, where Ie is a desired intensity value, a is a constant rate (%), and n is an integer.

2. An intensity distribution display method according to claim 1, wherein the sample is exposed to have a pattern of lines thereon corresponding to a desired LSI mask pattern.

3. An intensity distribution display method according to claim 1, wherein the desired intensity value is subjected to the sensitivity of a photosensitive layer of the sample.

4. An intensity distribution display method of displaying a intensity distribution of electromagnetic waves or charged particle beams fallen on a sample, comprising the step of:

displaying an inverse of the intensity distribution with the use of contour lines spaced at a constant rate relative to a desired exposure setting value.

5. An intensity distribution display method according to claim 4, wherein the sample is exposed to have a pattern of lines thereon corresponding to a desired LSI mask pattern.

6. An intensity distribution display method according to claim 4, wherein the intensity is subjected to the sensitivity of a photosensitive layer of the sample.

7. A mask pattern edit apparatus comprising:

means for inputting and editing the position of an LSI mask pattern;

intensity distribution calculation means for determining a intensity distribution fallen through the LSI mask pattern on a photosensitive layer of a sample;

display means for displaying the mask pattern and the intensity distribution at a time; and contour line calculation means for calculating and displaying the intensity distribution on the displaying means with the use of contour lines defined by $Ie/(1+a \cdot n/100)$, where Ie is a desired intensity value, a is a constant rate (%), and n is an integer.

8. A mask pattern edit apparatus comprising:

means for inputting and editing the position of an LSI mask pattern;

intensity distribution calculation means for determining a intensity distribution fallen through the LSI mask pattern on a photosensitive layer of a sample;

display means for displaying the mask pattern and the intensity distribution at a time;

contour line calculation means for calculating and displaying the intensity distribution on the displaying means with the use of contour lines defined by $Ie/(1+a \cdot n/100)$, where Ie is a desired intensity value, a is a constant rate (%), and n is an integer; and display switching means for selectively displaying either the contour lines determined by the contour line calculation means or the contour lines assigned at equal intervals of an intensity level.

9. A mask pattern edit apparatus comprising:

means for inputting and editing the position of an LSI mask pattern;

intensity distribution calculation means for determining a intensity distribution fallen through the LSI mask pattern on a photosensitive layer of a sample;

display means for displaying the mask pattern and the intensity distribution at a time; and contour line calculation means for calculating and displaying an inverse of the intensity distribution on the displaying means with the use of contour lines spaced at a constant rate relative to a desired exposure setting value.

10. A mask pattern edit apparatus comprising:

means for inputting and editing the position of an LSI mask pattern;

intensity distribution calculation means for determining a intensity distribution fallen through the LSI mask pattern on a photosensitive layer of a sample;

display means for displaying the mask pattern and the intensity distribution at a time;

contour line calculation means for calculating and displaying an inverse of the intensity distribution on the displaying means with the use of contour lines spaced at a constant rate relative to a desired exposure setting value; and display switching means for selectively displaying either the contour lines determined by the contour line calculation means or the contour lines assigned at equal intervals of an intensity level.

* * * * *